United States Patent
Hirayama et al.

(10) Patent No.: US 9,459,530 B2
(45) Date of Patent: Oct. 4, 2016

(54) PHOTOSENSITIVE EPOXY RESIN COMPOSITION, CURABLE FILM FOR FORMATION OF OPTICAL WAVEGUIDE CORE LAYER, AND OPTICAL WAVEGUIDE AND OPTICAL/ELECTRICAL TRANSMISSION HYBRID FLEXIBLE PRINTED WIRING BOARD PRODUCED BY USING THE PHOTOSENSITIVE EPOXY RESIN COMPOSITION OR THE CURABLE FILM

(71) Applicant: NITTO DENKO CORPORATION, Ibaraki-shi, Osaka (JP)

(72) Inventors: Tomoyuki Hirayama, Ibaraki (JP); Naoyuki Tanaka, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 14/785,933

(22) PCT Filed: Mar. 11, 2014

(86) PCT No.: PCT/JP2014/056227
§ 371 (c)(1),
(2) Date: Oct. 21, 2015

(87) PCT Pub. No.: WO2014/174923
PCT Pub. Date: Oct. 30, 2014

(65) Prior Publication Data
US 2016/0085151 A1    Mar. 24, 2016

(30) Foreign Application Priority Data

Apr. 23, 2013  (JP) ................. 2013-090316

(51) Int. Cl.

| | |
|---|---|
| G02B 6/10 | (2006.01) |
| G02B 6/12 | (2006.01) |
| C08F 2/50 | (2006.01) |
| G03F 7/038 | (2006.01) |
| C08G 59/20 | (2006.01) |
| C08G 59/68 | (2006.01) |
| G02B 1/04 | (2006.01) |
| G02B 6/138 | (2006.01) |
| G02B 6/122 | (2006.01) |
| H05K 1/02 | (2006.01) |
| H05K 1/03 | (2006.01) |

(52) U.S. Cl.
CPC ............. *G03F 7/0385* (2013.01); *C08G 59/20* (2013.01); *C08G 59/68* (2013.01); *G02B 1/046* (2013.01); *G02B 6/1221* (2013.01); *G02B 6/138* (2013.01); *G02B 2006/12073* (2013.01); *H05K 1/0274* (2013.01); *H05K 1/0326* (2013.01); *H05K 1/0393* (2013.01)

(58) Field of Classification Search
CPC ............... G02B 6/138; G02B 6/1221; G02B 2006/12073; G02B 1/046; G03F 7/0005; G03F 7/0385; G03F 7/039; C08G 59/20; C08G 59/68; C08L 63/00
USPC ............ 385/14, 129–132, 141–144; 522/1, 6
See application file for complete search history.

(56) References Cited

U.S. PATENT DOCUMENTS

| | | | |
|---|---|---|---|
| 8,787,723 B2 * | 7/2014 | Makino | ............... C08F 283/065 385/143 |
| 2011/0280531 A1 | 11/2011 | Hirayama | |
| 2012/0033913 A1 | 2/2012 | Kondou et al. | |

FOREIGN PATENT DOCUMENTS

| | | |
|---|---|---|
| JP | 2001-281475 A | 10/2001 |
| JP | 2010-197692 A | 9/2010 |
| JP | 2010-230944 A | 10/2010 |
| JP | 2011-27903 A | 2/2011 |
| JP | 2011-237645 A | 11/2011 |
| WO | 2007/129662 A1 | 11/2007 |

OTHER PUBLICATIONS

International Search Report dated May 27, 2014, issued in counterpart Application No. PCT/JP2014/056227 (1 page).
International Search Report dated Oct. 27, 2015, issued in counterpart International Application No. PCT/JP2014/056227 (5 pages).

* cited by examiner

*Primary Examiner* — Akm Enayet Ullah
*Assistant Examiner* — Michael Mooney
(74) *Attorney, Agent, or Firm* — Westerman, Hattori, Daniels & Adrian, LLP

(57) ABSTRACT

The present invention provides a photosensitive epoxy resin composition which contains: (A) a cresol novolak polyfunctional epoxy resin; (B) a liquid epoxy resin having a fluorene skeleton in its main chain; and (C) a photoacid generator; wherein the components (A) and (B) are present in a mixing weight ratio of (A)/(B)=40/60 to 60/40. Where the inventive photosensitive epoxy resin composition is used as an optical waveguide forming material, particularly as an optical waveguide core layer forming material for formation of a core layer, the optical waveguide core layer can be formed as having excellent reflow resistance and a lower loss through a coating process and a roll-to-roll process without altering the conventional production process.

11 Claims, No Drawings

PHOTOSENSITIVE EPOXY RESIN COMPOSITION, CURABLE FILM FOR FORMATION OF OPTICAL WAVEGUIDE CORE LAYER, AND OPTICAL WAVEGUIDE AND OPTICAL/ELECTRICAL TRANSMISSION HYBRID FLEXIBLE PRINTED WIRING BOARD PRODUCED BY USING THE PHOTOSENSITIVE EPOXY RESIN COMPOSITION OR THE CURABLE FILM

TECHNICAL FIELD

The present invention relates to a photosensitive epoxy resin composition for use as a material for formation of a core layer or the like of an optical waveguide of an optical/electrical transmission hybrid flexible printed wiring board to be widely used for optical communications, optical information processing and other general optics, a curable film for formation of an optical waveguide core layer, and an optical waveguide and an optical/electrical transmission hybrid flexible printed wiring board produced by using the photosensitive epoxy resin composition or the curable film.

BACKGROUND ART

Conventionally, a liquid photosensitive resin composition is used as an optical waveguide core layer material for an optical/electrical transmission hybrid flexible printed wiring board. Where a pattern of a core layer is to be formed by using the liquid photosensitive resin composition, the core layer is irradiated with ultraviolet (UV) radiation via a photo mask to be thereby formed into a desired core pattern. The photosensitive resin composition has a higher photo-curing sensitivity. However, a coating film of the photosensitive resin composition is liable to be broken because of its surface tackiness when being brought into contact with a roll in a continuous process such as a roll-to-roll (R-to-R) process employed for mass production. Therefore, the photosensitive resin composition is not adaptable to the R-to-R process, resulting in poorer productivity (PTL1).

In order to adapt the photosensitive resin composition to the continuous process such as the R-to-R process, a polymer material which is solid at an ordinary temperature is typically used as a photosensitive resin for the photosensitive resin composition. As the molecular weight of the polymer material is increased, the flexibility of an uncured amorphous film of the photosensitive resin composition is increased, but the patterning resolution (curing sensitivity) is reduced. As the molecular weight of the polymer material is reduced, on the other hand, the patterning resolution is increased, but the flexibility is reduced. In general, there is problematically a trade-off relationship between the flexibility and the patterning resolution of the film. Hence, there is a demand for an optical waveguide core layer material which satisfies the requirements for the flexibility and the patterning resolution of the photosensitive curable film, and a variety of such optical waveguide core layer materials have been proposed (PTL2).

The optical waveguide core layer material should satisfy requirements for various properties such as higher refractive index, higher transparency, higher resolution patternability and higher heat resistance when being cured according to its use purpose. Therefore, considerations are given to selection and balance of ingredients to be blended to satisfy the property requirements.

In order to adapt the optical waveguide core layer material to the R-to-R process for the mass production, as described above, an uncured film of the optical waveguide core layer material is generally provided in the form of a dry film. In the development of the material, the requirements for lower tackiness and higher flexibility of the uncured dry film material for the process adaptability reduce the design flexibility. In addition, it is necessary to provide laminate bases on opposite surfaces of the uncured film to provide the dry film. This is disadvantageous for resource saving and cost saving. Therefore, the adaptability to a wet process is also an important consideration in the development of the material (PTL3).

In view of the foregoing, a photosensitive resin composition is proposed, which is prepared, for example, by blending plural types of resins in addition to a base material of a specific novolak polyfunctional epoxy resin to satisfy the aforementioned property requirements (PTL4).

RELATED ART DOCUMENT

Patent Documents

PTL1: JP-A-2001-281475
PTL2: JP-A-2011-27903
PTL3: JP-A-2010-230944
PTL4: JP-A-2011-237645

SUMMARY OF INVENTION

However, the optical waveguide material for the optical/electrical transmission hybrid flexible printed wiring board is particularly required to have higher transparency, and reflow resistance to withstand a solder reflow process in the production process.

Thus, a photosensitive curable resin composition is eagerly desired which has higher transparency and reflow resistance as well as the conventional R-to-R adaptability and the higher resolution patternability, and is usable as the optical waveguide core layer material.

In view of the foregoing, it is an object of the present invention to provide a photosensitive epoxy resin composition which is usable as an optical waveguide forming material, particularly as a core layer forming material, and has higher transparency, proper R-to-R adaptability, higher resolution patternability and excellent reflow resistance, and a curable film for formation of an optical waveguide core layer, and to provide an optical waveguide and an optical/electrical transmission hybrid flexible printed wiring board produced by using the photosensitive epoxy resin composition or the curable film.

According to a first aspect of the present invention to achieve the above object, there is provided a photosensitive epoxy resin composition, which contains: (A) a cresol novolak polyfunctional epoxy resin; (B) a liquid epoxy resin having a fluorene skeleton in its main chain; and (C) a photoacid generator; wherein the components (A) and (B) are present in a mixing weight ratio of (A)/(B)=40/60 to 60/40.

According to a second aspect of the present invention, there is provided a curable film for formation of an optical waveguide core layer, the curable film being produced by forming the photosensitive epoxy resin composition of the first aspect into a film form.

According to a third aspect of the present invention, there is provided an optical waveguide, which includes a substrate, a cladding layer provided on the substrate, and a core layer provided in a predetermined pattern in the cladding layer for transmission of an optical signal, wherein the core layer is formed from the photosensitive epoxy resin composition of the first aspect or the curable film of the second aspect.

According to a fourth aspect of the present invention, there is provided an optical/electrical transmission hybrid flexible printed wiring board, which includes the optical waveguide of the third aspect.

The inventors of the present invention conducted intensive studies to provide a photosensitive epoxy resin composition for use as an optical waveguide core layer material having higher transparency, proper R-to-R adaptability, higher resolution patternability and excellent reflow resistance. As a result, the inventors found that the use of the photosensitive epoxy resin composition having the aforementioned formulation makes it possible to achieve the above object, and attained the present invention.

(1) The use of the cresol novolak polyfunctional epoxy resin which is photo-curable at a higher curing rate improves the higher resolution patternability.

(2) The blending of a material having a lower hue and less susceptible to thermal yellowing improves the reflow resistance, and reduces an optical loss.

(3) Although the R-to-R adaptability depends upon the flexibility of the dried coating film of the material at the ordinary temperature, it is possible to impart the uncured film of the photosensitive epoxy resin composition with the flexibility by blending the cresol novolak polyfunctional epoxy resin (which is solid at the ordinary temperature) and the epoxy resin having the fluorene skeleton in its main chain (which is liquid at the ordinary temperature) in the predetermined mixing weight ratio without impairing the other required properties.

(4) Since the tackiness of the dried coating film depends upon the proportion of the liquid component in the dried coating film, it is possible to impart the uncured film of the photosensitive epoxy resin composition with proper tackiness by blending the cresol novolak polyfunctional epoxy resin (which is solid at the ordinary temperature) and the epoxy resin having the fluorene skeleton in its main chain (which is liquid at the ordinary temperature) in the predetermined mixing weight ratio as described above. Thus, the inventors found that the use of the photosensitive epoxy resin composition having the aforementioned formulation ensures higher transparency, proper R-to-R adaptability, higher resolution patternability and excellent reflow resistance, and attained the present invention.

According to the present invention, the photosensitive epoxy resin composition contains the components (A) to (C), and the mixing weight ratio of the components (A) and (B) is (A)/(B)=40/60 to 60/40. Therefore, where the photosensitive epoxy resin composition is used for formation of an optical waveguide core layer, for example, the optical waveguide core layer can be formed as having excellent reflow resistance and a lower loss through the coating process and the R-to-R process without altering the conventional production process.

Where the resin component of the photosensitive epoxy resin composition contains 5 wt % of a liquid bisphenol-A epoxy resin, the tackiness is further reduced.

DESCRIPTION OF EMBODIMENTS

Embodiments of the present invention will hereinafter be described in detail. However, it should be understood that the present invention be not limited to the embodiments.

<Photosensitive Epoxy Resin Composition>

An inventive photosensitive epoxy resin composition is prepared by using: (A) a cresol novolak polyfunctional epoxy resin; (B) a liquid epoxy resin having a fluorene skeleton in its main chain (hereinafter sometimes referred to as "specific liquid epoxy resin"); and (C) a photoacid generator. In the present invention, the term "liquid" means that the material is in a liquid state (has liquidity) at an ordinary temperature (25° C.), and the term "solid" means that the material is in a solid state at the ordinary temperature (25° C.).

The components (A) to (C) and other components will hereinafter be described in order.

<Cresol Novolak Polyfunctional Epoxy Resin (A)>

The cresol novolak polyfunctional epoxy resin (A) is generally solid at the ordinary temperature and is, for example, a cresol novolak epoxy resin represented by the following general formula (1):

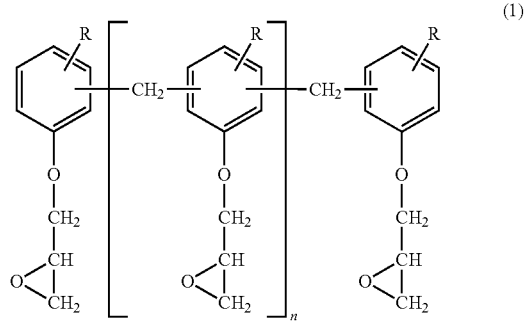

wherein groups R, which may be the same or different, are each a C1 to C6 alkyl group, and n is a positive number.

In the formula (1), all the groups R are preferably methyl groups. Specific examples of the cresol novolak epoxy resin include YDCN-704A, YDCN-700-10, YDCN-700-7 and YDCN-700-5 (available from Nippon Steel & Sumikin Chemical Co., Ltd.), which may be used either alone or in combination.

<Specific Liquid Epoxy Resin (B)>

The specific liquid epoxy resin (B) is a liquid epoxy resin having a fluorene skeleton in its main chain, and is liquid at the ordinary temperature. The specific liquid epoxy resin (B) is, for example, an epoxy resin represented by the following general formula (2):

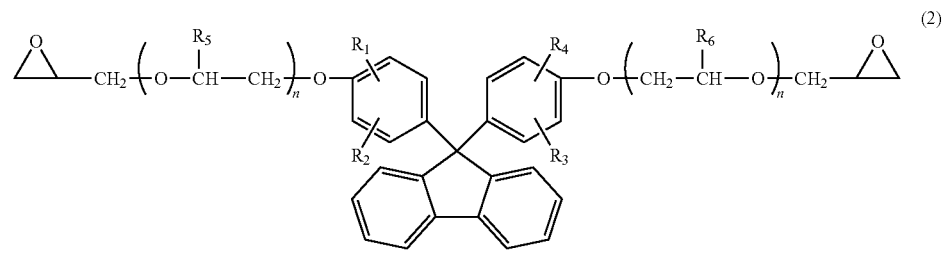

wherein $R_1$ to $R_4$, which may be the same or different, are each a hydrogen atom or a C1 to C6 alkyl group; $R_5$ and $R_6$, which may be the same or different, are each a hydrogen atom or a methyl group; and each n is an integer of 0 to 10 which may be the same or different.

In the formula (2), $R_1$ to $R_4$ are preferably each a hydrogen atom. A specific example of the epoxy resin (B) is OGSOL EG-200 available from Osaka Gas Chemicals Co., Ltd.

In the present invention, the mixing weight ratio (A)/(B) between the cresol novolak polyfunctional epoxy resin (A) and the specific liquid epoxy resin (B) should be (A)/(B)=40/60 to 60/40. The mixing weight ratio (A)/(B) is more preferably 45/55 to 55/45, particularly preferably 50/50. If the weight ratio of the component (A) is excessively great, a film of the photosensitive epoxy resin composition is liable to suffer from cracking during the R-to-R process. If the weight ratio of the component (B) is excessively great, a core layer formed from the photosensitive epoxy resin composition is liable to have poorer patternability during the patterning process.

The inventive photosensitive epoxy resin composition may contain a liquid bisphenol-A epoxy resin in addition to the components (A) and (B) as a resin component thereof. Where the liquid bisphenol-A epoxy resin is contained, the proportion of the liquid bisphenol-A epoxy resin is preferably not greater than 5 wt %, more preferably not greater than 3 wt %, further more preferably not greater than 1 wt %, based on the weight of the resin component. If the proportion of the liquid bisphenol-A epoxy resin is excessively great, the tackiness is liable to increase. Where the liquid bisphenol-A epoxy resin is used, the proportion of the liquid bisphenol-A epoxy resin is preferably not greater than 5 wt % as described above. Depending on the use arrangement, therefore, either a case in which the liquid bisphenol-A epoxy resin is used preferably in a proportion of not greater than 5 wt % or a case in which the liquid bisphenol-A epoxy resin is not used (only the components (A) and (B) are used as the resin component) is properly selected.

<Photoacid Generator (C)>

The photoacid generator (C) is used for imparting the photosensitive epoxy resin composition with photo-curability, e.g., with UV curability.

Examples of the photoacid generator (C) include photocationic curing initiators such as benzoins, benzoin alkyl ethers, acetophenones, aminoacetophenones, anthraquinones, thioxanthones, ketals, benzophenones, xanthones and phosphine oxides. Specific examples of the photoacid generator include triphenylsulfonium antimony hexafluoride, 2,2-dimethoxy-1,2-diphenylethan-1-one, 1-hydroxycyclohexyl phenyl ketone, 2-hydroxy-2-methyl-1-phenylpropan-1-one, 1-[4-(2-hydroxyethoxy)phenyl]-2-hydroxy-2-methyl-1-propane, 2-hydroxy-1-{4-[4-(2-hydroxy-2-methylpropionyl)benzyl]phenyl}-2-methylpropan-1-one, 2-benzyl-2-dimethylamino-1-(4-morpholinophenyl)-butanone-1,2-methyl-1-(4-methylthiophenyl)-2-morpholinopropan-1-one, bis(2,4,6-trimethylbenzoyl)phenylphosphine oxide, 2,4,6-trimethylbenzoyldiphenylphosphine oxide, bis(η5-2,4-cyclopentadien-1-yl)-bis[2,6-difluoro-3-(1H-pyrrol-1-yl)phenyl]titanium and 2-hydroxy-1-{4-[4-(2-hydroxy-2-methylpropionyl)benzyl]phenyl}-2-methylpropan-1-one, which may be used either alone or in combination. Among these compounds, triphenylsulfonium antimony hexafluoride, 2,2-dimethoxy-1,2-diphenylethan-1-one, 1-hydroxycyclohexyl phenyl ketone and 2-hydroxy-1-{4-[4-(2-hydroxy-2-methylpropionyl)benzyl]phenyl}-2-methylpropan-1-one are preferred.

The proportion of the photoacid generator (C) is preferably 0.1 to 10 parts by weight, more preferably 0.3 to 3 parts by weight, particularly preferably 0.5 to 2 parts by weight, based on 100 parts by weight of the resin component of the photosensitive epoxy resin composition. If the proportion of the photoacid generator (C) is excessively small, it will be difficult to provide satisfactory photo-curability by irradiation with light (by irradiation with ultraviolet radiation). If the proportion of the photoacid generator (C) is excessively great, the photosensitivity is liable to increase. This may result in an abnormal pattern configuration in the patterning, and make it difficult to provide a required loss characteristic after the reflow.

In addition to the cresol novolak polyfunctional epoxy resin (A), the specific liquid epoxy resin (B), the photoacid generator (C), and the liquid bisphenol-A epoxy resin described above, as required, the inventive photosensitive epoxy resin composition may contain a silane or titanium coupling agent for increasing the adhesiveness, an olefin oligomer, a cycloolefin oligomer or polymer such as a norbornene polymer, a synthetic rubber, a silicone compound or other flexibilizer, an antioxidant and a defoaming agent. These additives are each blended in a proportion that does not impair the effects of the present invention. These additives may be used either alone or in combination.

The inventive photosensitive epoxy resin composition may be prepared by mixing the cresol novolak polyfunctional epoxy resin (A), the specific liquid epoxy resin (B), the photoacid generator (C), the liquid bisphenol-A epoxy resin described above and, as required, the additives in predetermined proportions with stirring. The inventive photosensitive epoxy resin composition may be prepared in the form of a coating varnish by dissolving the aforementioned ingredients in an organic solvent with heating (e.g., to about 60° C. to 90° C.) and stirring.

Examples of the organic solvent to be used for the preparation of the coating varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used either alone or in combination in a proper amount so as to impart the resin composition with a viscosity suitable for the coating.

<<Optical Waveguide>>

An optical waveguide to be produced by employing the inventive photosensitive epoxy resin composition as a core layer forming material will be described.

The optical waveguide according to the present invention includes, for example, a substrate, a cladding layer (under-cladding layer) provided in a predetermined pattern on the substrate, a core layer provided in a predetermined pattern on the cladding layer for transmission of optical signals, and another cladding layer (over-cladding layer) provided over the core layer. In the optical waveguide according to the present invention, the core layer is formed from the aforementioned photosensitive epoxy resin composition. An under-cladding layer forming material and an over-cladding layer forming material may be epoxy resin compositions having the same formulation or different formulations for formation of the cladding layers. In the optical waveguide according to the present invention, the cladding layers are each required to have a lower refractive index than the core layer.

The (cured) core layer formed by using the inventive photosensitive epoxy resin composition preferably has a refractive index of not lower than 1.59, particularly preferably not lower than 1.596. The refractive index of the (cured) core layer is measured, for example, in the following manner. A (cured) core layer having a thickness of about 50 μm is formed on a smooth surface of a silicon wafer, and the refractive index of the cured core layer is measured at 850 nm by means of a prism coupler (SPA-4000) available from SAIRON TECHNOLOGY, Inc.

In the present invention, the optical waveguide is produced, for example, through the following process steps. A substrate is prepared, and a photosensitive varnish (cladding layer forming material) prepared by dissolving a photosensitive epoxy resin composition in an organic solvent is applied on the substrate. A photomask for exposure in a predetermined pattern (optical waveguide pattern) is provided on the resulting varnish coating film. Then, the varnish coating film is irradiated with light such as ultraviolet radiation via the photomask and, as required, heat-treated to be thereby cured. Thereafter, an unexposed portion of the varnish coating film not irradiated with the light is dissolved away with the use of a developing liquid. Thus, the under-cladding layer (lower cladding layer portion) is formed as having the predetermined pattern.

In turn, a core layer forming material (photosensitive varnish) prepared by dissolving the inventive photosensitive epoxy resin composition in the organic solvent is applied on the under-cladding layer to form an uncured core formation layer. After the application of the core layer forming material (photosensitive varnish), the organic solvent is removed by heat-drying, whereby an uncured curable film for formation of the optical waveguide core layer is formed. Then, a photomask for exposure in a predetermined pattern (optical waveguide pattern) is provided on the uncured core formation layer. Subsequently, the core formation layer is irradiated with light such as ultraviolet radiation via the photomask and, as required, heat-treated. Thereafter, an unexposed portion of the uncured core formation layer is dissolved away with the use of a developing liquid. Thus, the core layer is formed as having the predetermined pattern.

Subsequently, the photosensitive varnish (cladding layer forming material) prepared by dissolving the photosensitive epoxy resin composition in the organic solvent is applied over the core layer. Then, the resulting varnish coating film is irradiated with light such as ultraviolet radiation and, as required, heat-treated, whereby the over-cladding layer (upper cladding layer portion) is formed. Thus, the intended optical waveguide is produced through these process steps.

Exemplary substrate materials include a silicon wafer, a metal substrate, a polymer film and a glass substrate. Examples of the metal substrate include stainless steel plates such as of JIS SUS. Specific examples of the polymer film include a polyethylene terephthalate (PET) film, a polyethylene naphthalate film and a polyimide film. The substrate typically has a thickness of 10 μm to 3 mm.

Specifically, the light irradiation may be irradiation with ultraviolet radiation. Exemplary light sources for the irradiation with the ultraviolet radiation include a low pressure mercury lamp, a high pressure mercury lamp and an ultra-high pressure mercury lamp. The dose of the ultraviolet radiation is typically about 10 to about 20000 $mJ/cm^2$, preferably about 100 to about 15000 $mJ/cm^2$, more preferably about 500 to about 10000 $mJ/cm^2$.

After the exposure by the irradiation with the ultraviolet radiation, a heat treatment may be further performed to complete a photoreaction for the curing. Conditions for the heat treatment are typically a temperature of 80° C. to 250° C. and a period of 10 seconds to 2 hours, preferably a temperature of 100° C. to 150° C. and a period of 5 minutes to 1 hour.

The cladding layer forming material may be, for example, a resin composition containing a liquid epoxy resin such as a liquid bisphenol-A epoxy resin, a liquid bisphenol-F epoxy resin or a liquid hydrogenated bisphenol-A epoxy resin, a solid epoxy resin and the photoacid generator described above. The cladding layer forming material is prepared in the form of a varnish for the coating. Therefore, a proper amount of a conventionally known organic solvent is added to the ingredients to impart the varnish with a viscosity suitable for the coating.

As in the aforementioned case, examples of the organic solvent to be used for the preparation of the varnish include ethyl lactate, methyl ethyl ketone, cyclohexanone, 2-butanone, N,N-dimethylacetamide, diglyme, diethylene glycol methyl ethyl ether, propylene glycol methyl acetate, propylene glycol monomethyl ether, tetramethylfurane and dimethoxyethane. These organic solvents may be used either alone or in combination in a proper amount so as to impart the varnish with a viscosity suitable for the coating.

Exemplary methods for application of each of the layer forming materials on the substrate include coating methods employing a spin coater, a coater, a round coater, a bar coater or the like, a screen printing method, a capillary injection method in which the material is injected into a gap formed with the use of spacers by the capillary phenomenon, and a continuous roll-to-roll coating method employing a coating machine such as a multi-coater. The optical waveguide may be provided in the form of a film optical waveguide by removing the substrate.

The optical waveguide thus produced can be used as an optical waveguide for an optical/electrical transmission hybrid flexible printed wiring board.

EXAMPLES

Next, the present invention will be described by way of examples thereof. However, it should be understood that the present invention be not limited to these examples. In the examples, "parts" and "%" are based on weight unless otherwise specified.

Example 1

Prior to production of an optical waveguide according to this example, photosensitive varnishes were prepared as a cladding layer forming material and a core layer forming material.

<Preparation of Cladding Layer Forming Material>

Under shaded conditions, 80 parts of a liquid long-chain bi-functional semi-aliphatic epoxy resin (EXA-4816 available from DIC Corporation), 20 parts of a solid polyfunctional aliphatic epoxy resin (EHPE 3150 available from Daicel Chemical Industries Ltd.) and 2.0 parts of a photoacid generator (ADEKAOPTOMER SP-170 available from Adeka Corporation) were mixed with 40 parts of ethyl lactate, and completely dissolved in ethyl lactate at 85° C. with heating and stirring by means of a hybrid mixer (MH500 available from KEYENCE Corporation). Then, the resulting mixture was cooled to room temperature (25° C.), and then filtered by a heat and pressure filtering process with the use of a membrane filter having a pore diameter of 1.0 μm. Thus, a photosensitive varnish was prepared as the cladding layer forming material.

<Preparation of Core Layer Forming Material>

Under shaded conditions, 60 parts of a solid polyfunctional aromatic epoxy resin (YDCN-700-10 available from Nippon Steel & Sumikin Chemical Co., Ltd.), 40 parts of a liquid (viscous) fluorene skeleton-containing bi-functional epoxy resin (OGSOL EG-200 available from Osaka Gas Chemicals Co., Ltd.) and 1.0 part of a photoacid generator c1 (ADEKAOPTOMER SP-170 available from Adeka Corporation) were mixed with 40 parts of ethyl lactate, and completely dissolved in ethyl lactate at 85° C. with heating and stirring. Then, the resulting mixture was cooled to room temperature (25° C.), and then filtered by a heat and pressure filtering process with the use of a membrane filter having a pore diameter of 1.0 μm. Thus, a photosensitive varnish was prepared as the core layer forming material.

[Production of Optical Waveguide Combined with Flexible Printed Wiring Board (FPC)]

<Formation of Under-Cladding Layer>

The aforementioned photosensitive varnish as the cladding layer forming material was applied on a back surface of a flexible printed wiring board substrate (FPC substrate) having an overall thickness of 22 μm by means of a spin coater, and then the organic solvent was dried on a hot plate (at 130° C. for 10 minutes), whereby an uncured under-cladding formation layer was formed (It is noted that, if the substrate is removed in this state, a curable film for formation of an optical waveguide is provided). The uncured under-cladding formation layer thus formed was exposed to light via a predetermined mask pattern (pattern width/pattern pitch (L/S)=50 μm/200 μm) by means of a UV irradiation machine (at 5000 mJ/cm$^2$ (with an I-line filter)), and then subjected to a post heat treatment (at 130° C. for 10 minutes). Thereafter, the resulting under-cladding formation layer was developed in γ-butyrolactone (at 25° C. for 3 minutes) and rinsed with water, and then dried on a hot plate (at 120° C. for 10 minutes) for removal of water. Thus, an under-cladding layer (having a thickness of 15 μm) was formed.

<Formation of Core Layer>

The aforementioned photosensitive varnish as the core layer forming material was applied on the thus formed under-cladding layer by means of a spin coater, and then the organic solvent was dried on a hot plate (at 130° C. for 5 minutes). Thus, an uncured core formation layer was formed in an uncured film state. The uncured core formation layer thus formed was exposed to light via a predetermined mask pattern (pattern width/pattern pitch (L/S)=50 μm/200 μm) by means of a UV irradiation machine (at 9000 mJ/cm$^2$ (with an I-line filter)), and then subjected to a post heat treatment (at 130° C. for 10 minutes). Thereafter, the resulting core formation layer was developed in γ-butyrolactone (at 25° C. for 4 minutes) and rinsed with water, and then dried on a hot plate (at 120° C. for 10 minutes) for removal of water. Thus, a core layer (having a thickness of 50 μm) was formed as having the predetermined pattern.

<Formation of Over-Cladding Layer>

The aforementioned photosensitive varnish as the cladding layer forming material was applied over the thus formed core layer by means of a spin coater. Thus, an uncured over-cladding formation layer was formed. The uncured over-cladding formation layer thus formed was exposed to light by means of a UV irradiation machine (at 5000 mJ/cm$^2$ (with an I-line filter)), and then subjected to a post heat treatment (at 130° C. for 10 minutes). Thereafter, the resulting over-cladding formation layer was developed in γ-butyrolactone (at 25° C. for 3 minutes) and rinsed with water, and then dried on a hot plate (at 120° C. for 10 minutes) for removal of water. Thus, an over-cladding layer (having a thickness of 10 μm) was formed.

In this manner, an optical waveguide (having a thickness of 75 μm) was produced, which was combined with the FPC substrate and included the under-cladding layer formed on the FPC substrate, the core layer formed in the predetermined pattern on the under-cladding layer, and the over-cladding layer formed over the core layer.

Example 2

An optical waveguide was produced in substantially the same manner as in Example 1, except that, in the preparation of the photosensitive varnish as the core layer forming material, the formulation of the resin component was changed to include 55 parts of the solid polyfunctional aromatic epoxy resin (YDCN-700-10 available from Nippon Steel & Sumikin Chemical Co., Ltd.) and 45 parts of the liquid (viscous) fluorene skeleton-containing bi-functional epoxy resin (OGSOL EG-200 available from Osaka Gas Chemicals Co., Ltd.)

Example 3

An optical waveguide was produced in substantially the same manner as in Example 1, except that, in the preparation of the photosensitive varnish as the core layer forming material, the formulation of the resin component was changed to include 50 parts of the solid polyfunctional aromatic epoxy resin (YDCN-700-10 available from Nippon Steel & Sumikin Chemical Co., Ltd.) and 50 parts of the liquid (viscous) fluorene skeleton-containing bi-functional epoxy resin (OGSOL EG-200 available from Osaka Gas Chemicals Co., Ltd.)

Example 4

An optical waveguide was produced in substantially the same manner as in Example 1, except that, in the preparation of the photosensitive varnish as the core layer forming material, the formulation of the resin component was changed to include 45 parts of the solid polyfunctional aromatic epoxy resin (YDCN-700-10 available from Nippon Steel & Sumikin Chemical Co., Ltd.) and 55 parts of the liquid (viscous) fluorene skeleton-containing bi-functional epoxy resin (OGSOL EG-200 available from Osaka Gas Chemicals Co., Ltd.)

Example 5

An optical waveguide was produced in substantially the same manner as in Example 1, except that, in the preparation of the photosensitive varnish as the core layer forming material, the formulation of the resin component was changed to include 40 parts of the solid polyfunctional aromatic epoxy resin (YDCN-700-10 available from Nippon Steel & Sumikin Chemical Co., Ltd.) and 60 parts of the liquid (viscous) fluorene skeleton-containing bi-functional epoxy resin (OGSOL EG-200 available from Osaka Gas Chemicals Co., Ltd.)

Example 6

An optical waveguide was produced in substantially the same manner as in Example 1, except that, in the preparation of the photosensitive varnish as the core layer forming material, the formulation of the resin component was changed to include 49 parts of the solid polyfunctional aromatic epoxy resin (YDCN-700-10 available from Nippon Steel & Sumikin Chemical Co., Ltd.), 50 parts of the liquid (viscous) fluorene skeleton-containing bi-functional epoxy resin (OGSOL EG-200 available from Osaka Gas Chemicals Co., Ltd.) and 1 part of a liquid bisphenol-A epoxy resin (JER828 available from Mitsubishi Chemical Corporation).

Example 7

An optical waveguide was produced in substantially the same manner as in Example 1, except that, in the preparation of the photosensitive varnish as the core layer forming material, the formulation of the resin component was changed to include 47 parts of the solid polyfunctional aromatic epoxy resin (YDCN-700-10 available from Nippon Steel & Sumikin Chemical Co., Ltd.), 50 parts of the liquid (viscous) fluorene skeleton-containing bi-functional epoxy resin (OGSOL EG-200 available from Osaka Gas Chemicals Co., Ltd.) and 3 parts of the liquid bisphenol-A epoxy resin (JER828 available from Mitsubishi Chemical Corporation).

Example 8

An optical waveguide was produced in substantially the same manner as in Example 1, except that, in the preparation of the photosensitive varnish as the core layer forming material, the formulation of the resin component was changed to include 45 parts of the solid polyfunctional aromatic epoxy resin (YDCN-700-10 available from Nippon Steel & Sumikin Chemical Co., Ltd.), 50 parts of the liquid (viscous) fluorene skeleton-containing bi-functional epoxy resin (OGSOL EG-200 available from Osaka Gas Chemicals Co., Ltd.) and 5 parts of the liquid bisphenol-A epoxy resin (JER828 available from Mitsubishi Chemical Corporation).

Comparative Example 1

An optical waveguide was produced in substantially the same manner as in Example 1, except that, in the preparation of the photosensitive varnish as the core layer forming material, the formulation of the resin component was changed to include 100 parts of the solid polyfunctional aromatic epoxy resin (YDCN-700-10 available from Nippon Steel & Sumikin Chemical Co., Ltd.) alone.

Comparative Example 2

An optical waveguide was produced in substantially the same manner as in Example 1, except that, in the preparation of the photosensitive varnish as the core layer forming material, the formulation of the resin component was changed to include 70 parts of the solid polyfunctional aromatic epoxy resin (YDCN-700-10 available from Nippon Steel & Sumikin Chemical Co., Ltd.) and 30 parts of the liquid (viscous) fluorene skeleton-containing bi-functional epoxy resin (OGSOL EG-200 available from Osaka Gas Chemicals Co., Ltd.)

Comparative Example 3

An optical waveguide was produced in substantially the same manner as in Example 1, except that, in the preparation of the photosensitive varnish as the core layer forming material, the formulation of the resin component was changed to include 30 parts of the solid polyfunctional aromatic epoxy resin (YDCN-700-10 available from Nippon Steel & Sumikin Chemical Co., Ltd.) and 70 parts of the liquid (viscous) fluorene skeleton-containing bi-functional epoxy resin (OGSOL EG-200 available from Osaka Gas Chemicals Co., Ltd.)

Comparative Example 4

An optical waveguide was produced in substantially the same manner as in Example 1, except that, in the preparation of the photosensitive varnish as the core layer forming material, the formulation of the resin component was changed to include 100 parts of a solid novolak polyfunctional epoxy resin (157S70 available from Mitsubishi Chemical Corporation) alone, and 1.0 part of CPI-200K available from San-Apro Ltd. (photoacid generator c2) was used as the photoacid generator.

With the use of the photosensitive varnishes thus prepared as the core layer forming materials, and the optical waveguides thus produced, a tackiness evaluation, an R-to-R adaptability (cracking) evaluation and a patternability evaluation for the core layer forming materials, and a waveguide loss evaluation (linear loss) and a reflow resistance evaluation for the optical waveguides were performed in the following manner. The results of these evaluations are shown below along with the formulations of the varnishes in Tables 1 and 2.

[Tackiness Evaluation]

The photosensitive varnishes prepared as the core layer forming materials in Examples and Comparative Examples were each applied on a 0.8-mm thick silicon wafer by means of a spin coater, and dried on a hot plate (at 130° C. for 5 minutes) to form an uncured film, which was in turn subjected to a post heat treatment (at 130° C. for 10 minutes). Thus, a cured film having a thickness of about 50 μm was provided. The surface of the cured film was checked by finger touch, and evaluated based on the following criteria:

Acceptable (○): The cured film was free from tackiness and surface roughening.

Unacceptable (x): The cured film had tackiness and suffered from surface roughening.

[R-to-R Adaptability (Cracking) Evaluation]

The photosensitive varnishes prepared as the core layer forming materials in Examples and Comparative Examples were each applied on a 50-μm thick stainless steel base by means of a spin coater, and dried (at 130° C. for 10 minutes) to form an uncured film having a thickness of about 50 μm. The uncured film (amorphous film) formed on the stainless steel base was wound up around a 10-cm diameter winding core. The film was visually checked for cracking, and evaluated based on the following criteria:

Acceptable (∘): The film was free from cracking.
Unacceptable (x): The film suffered from cracking.

[Patternability Evaluation]

The core layer pattern formed on the under-cladding layer by using each of the photosensitive varnishes prepared as the core layer forming materials in Examples and Comparative Examples was checked by means of an optical microscope, and evaluated based on the following criteria:

Acceptable (∘): The core layer pattern was rectangular without pattern waviness and bottom expansion.
Unacceptable (x): The core layer pattern was not rectangular with configurational abnormality such as pattern waviness or bottom expansion.

[Waveguide Loss Evaluation (Linear Loss)]

The optical waveguides produced in Examples and Comparative Examples were each used as a sample. Light emitted from a light source (850-nm VCSEL light source OP250 available from Miki Inc.) was collected and inputted into the sample by means of a multi-mode fiber (FFP-G120-0500 available from Miki Inc.) having an MMF diameter of 50 μm and an NA of 0.2. Then, light outputted from the sample was collected by a lens (FH14-11 available from Seiwa Optical Co., Ltd.) having a magnification of 20× and an NA of 0.4, and detected at 6 channels by a light measurement system (optical multi-power meter Q8221 available from Advantest Corporation) for evaluation. The sample was evaluated for the linear loss from an average total loss for the six channels based on the following criteria:

Acceptable (∘): The sample had a total linear loss of not greater than 0.1 dB/cm.
Unacceptable (x): The sample had a total linear loss of greater than 0.1 dB/cm.

[Reflow Resistance Evaluation]

The optical waveguides produced in Examples and Comparative Examples were each used as a sample. The sample was exposed to a heating process at a peak temperature of 250° C. to 255° C. for 45 seconds in a nitrogen atmosphere by means of a reflow simulator (SMT Scope SK-5000 available from Sanyoseiko Co., Ltd.) Then, the sample was checked in the aforementioned manner, and evaluated for the waveguide loss (linear loss) based on the following criteria:

Acceptable (∘): The sample had a total linear loss of not greater than 0.1 dB/cm after the reflow heating process.
Unacceptable (x): The sample had a total linear loss of greater than 0.1 dB/cm after the reflow heating process.

TABLE 1

| | Example (parts) | | | | | | | |
|---|---|---|---|---|---|---|---|---|
| | 1 | 2 | 3 | 4 | 5 | 6 | 7 | 8 |
| YDCN-700-10 (A) | 60 | 55 | 50 | 45 | 40 | 49 | 47 | 45 |
| 157S70 | — | — | — | — | — | — | — | — |
| OGSOL EG-200 (B) | 40 | 45 | 50 | 55 | 60 | 50 | 50 | 50 |
| Liquid bisphenol-A epoxy resin | — | — | — | — | — | 1 | 3 | 5 |
| Photoacid generator c1 (C) | 1 | 1 | 1 | 1 | 1 | 1 | 1 | 1 |
| Photoacid generator c2 | — | — | — | — | — | — | — | — |
| Ethyl lactate | 40 | 40 | 40 | 40 | 40 | 40 | 40 | 40 |
| Tackiness | ∘ | ∘ | ∘ | ∘ | ∘ | ∘ | ∘ | ∘ |
| R-to-R adaptability (cracking) | ∘ | ∘ | ∘ | ∘ | ∘ | ∘ | ∘ | ∘ |
| Patternability | ∘ | ∘ | ∘ | ∘ | ∘ | ∘ | ∘ | ∘ |
| Linear loss | ∘ | ∘ | ∘ | ∘ | ∘ | ∘ | ∘ | ∘ |
| Reflow resistance | ∘ | ∘ | ∘ | ∘ | ∘ | ∘ | ∘ | ∘ |

TABLE 2

| | Comparative Example (parts) | | | |
|---|---|---|---|---|
| | 1 | 2 | 3 | 4 |
| YDCN-700-10 (A) | 100 | 70 | 30 | — |
| 157S70 | — | — | — | 100 |
| OGSOL EG-200 (B) | — | 30 | 70 | — |
| Liquid bisphenol-A epoxy resin | — | — | — | — |
| Photoacid generator c1 (C) | 1 | 1 | 1 | — |
| Photoacid generator c2 | — | — | — | 1 |
| Ethyl lactate | 40 | 40 | 40 | 40 |
| Tackiness | ∘ | ∘ | x | ∘ |
| R-to-R adaptability (cracking) | x | x | ∘ | ∘ |
| Patternability | ∘ | ∘ | x | ∘ |
| Linear loss | ∘ | ∘ | ∘ | x |
| Reflow resistance | ∘ | ∘ | ∘ | x |

The above results indicate that the photosensitive epoxy resin compositions (Examples) each containing the cresol novolak polyfunctional epoxy resin (A) and the specific liquid epoxy resin (B) in a mixing weight ratio falling within the predetermined range and the optical waveguides including the core layers formed from these photosensitive epoxy resin compositions each had excellent results in the tackiness evaluation, the R-to-R adaptability (cracking) evaluation, the patternability evaluation, the waveguide loss evaluation (linear loss) and the reflow resistance evaluation.

In contrast, the photosensitive epoxy resin compositions each containing the cresol novolak polyfunctional epoxy resin (A) and the specific liquid epoxy resin (B) in a mixing weight ratio falling outside the predetermined range or the photosensitive epoxy resin composition containing the cresol novolak polyfunctional epoxy resin (A) alone (Comparative Examples), and the optical waveguides including the core layers formed from these photosensitive epoxy resin compositions each had unsatisfactory results in at least one of the tackiness evaluation, the R-to-R adaptability (cracking) evaluation, the patternability evaluation, the waveguide loss evaluation (linear loss) and the reflow resistance evaluation.

The optical waveguide produced by using the photosensitive epoxy resin composition (Comparative Example 4) containing the solid novolak polyfunctional epoxy resin (157S70 available from Mitsubishi Chemical Corporation) alone instead of the cresol novolak polyfunctional epoxy resin (A) (solid polyfunctional aromatic epoxy resin YDCN-700-10 available from Nippon Steel & Sumikin Chemical Co., Ltd.) without the use of the specific liquid epoxy resin (B) had unsatisfactory results in the waveguide loss evaluation (linear loss) and the reflow resistance evaluation.

While specific forms of the embodiments of the present invention have been shown in the aforementioned inventive examples, the inventive examples are merely illustrative of the invention but not limitative of the invention. It is contemplated that various modifications apparent to those skilled in the art could be made within the scope of the invention.

The inventive photosensitive epoxy resin composition is useful as an optical waveguide component forming material, particularly as a core layer forming material. Further, the optical waveguide produced by using the aforementioned photosensitive epoxy resin composition is usable, for example, as an optical/electrical transmission hybrid flexible printed wiring board and the like.

What is claimed is:

1. A photosensitive epoxy resin composition comprising:
   (A) a cresol novolak polyfunctional epoxy resin;
   (B) a liquid epoxy resin having a fluorene skeleton in its main chain; and
   (C) a photoacid generator;
   wherein the components (A) and (B) are present in a mixing weight ratio of (A)/(B)=40/60 to 60/40.

2. The photosensitive epoxy resin composition according to claim 1, further comprising not greater than 5 wt % of a liquid bisphenol-A epoxy resin based on the weight of a resin component of the photosensitive epoxy resin composition.

3. The photosensitive epoxy resin composition according to claim 1, wherein the photoacid generator (C) is present in a proportion of 0.1 to 10 parts by weight based on 100 parts by weight of a resin component of the photosensitive epoxy resin composition.

4. The photosensitive epoxy resin composition according to claim 1, wherein the cresol novolak polyfunctional epoxy resin (A) is a cresol novolak polyfunctional epoxy resin represented by the following general formula (1):

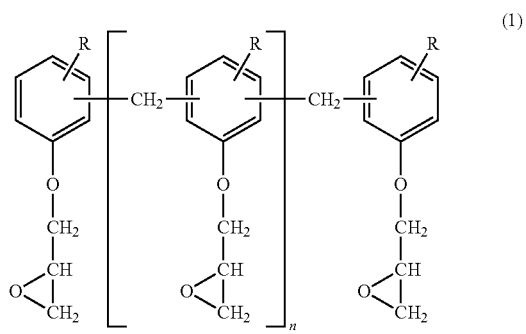

wherein groups R, which may be the same or different, are each a C1 to C6 alkyl group, and n is a positive number.

5. The photosensitive epoxy resin composition according to claim 1, wherein the liquid epoxy resin (B) having the fluorene skeleton in its main chain is a liquid epoxy resin represented by the following general formula (2):

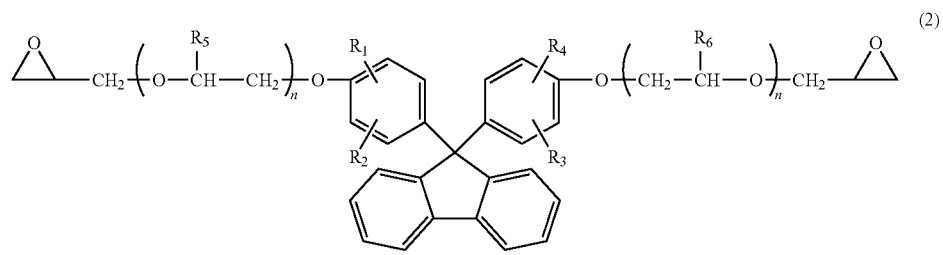

wherein $R_1$ to $R_4$, which may be the same or different, are each a hydrogen atom or a C1 to C6 alkyl group;
wherein $R_5$ and $R_6$, which may be the same or different, are each a hydrogen atom or a methyl group; and
wherein each n is an integer of 0 to 10 which may be the same or different.

6. The photosensitive epoxy resin composition according to claim 1, Which is a core layer forming material for an optical waveguide including a substrate, a cladding layer provided on the substrate, and a core layer provided in a predetermined pattern in the cladding layer for transmission of an optical signal.

7. A curable film for formation of an optical waveguide core layer, the curable film comprising the photosensitive epoxy resin composition according to claim 1.

8. An optical waveguide comprising:
   a substrate;
   a cladding layer provided on the substrate; and
   a core layer provided in a predetermined pattern in the cladding layer for transmission of an optical signal;
   wherein the core layer is formed from the photosensitive epoxy resin composition according to claim 1.

9. An optical waveguide comprising:
   a substrate;
   a cladding layer provided on the substrate; and
   a core layer provided in a predetermined pattern in the cladding layer for transmission of an optical signal;
   wherein the core layer is formed from the curable film according to claim 7.

10. An optical/electrical transmission hybrid flexible printed wiring board comprising:
a flexible printed wiring board substrate; and
an optical waveguide provided on the flexible printed wiring board substrate;
wherein the optical waveguide is the optical waveguide according to claim 8.

11. An optical/electrical transmission hybrid flexible printed wiring board comprising:
a flexible printed wiring board substrate; and
an optical waveguide provided on the flexible printed wiring board substrate;
wherein the optical waveguide is the optical waveguide according to claim 9.

* * * * *